United States Patent [19]

Anthony et al.

[11] 4,224,594
[45] Sep. 23, 1980

[54] DEEP DIODE MAGNETORESISTOR

[75] Inventors: Thomas R. Anthony, Schenectady, N.Y.; Harvey E. Cline, Stanford, Calif.

[73] Assignee: General Electric Company, Schenectady, N.Y.

[21] Appl. No.: 972,387

[22] Filed: Dec. 22, 1978

[51] Int. Cl.² .................................... H01L 43/00
[52] U.S. Cl. .................................... 338/32 R; 357/27
[58] Field of Search ............ 338/32 R, 32 H; 357/27, 357/60, 63, 64; 29/610; 148/1.5, 171, 172, 177, 176, 188

[56] References Cited

U.S. PATENT DOCUMENTS

| 3,567,946 | 3/1971 | Paul | 357/27 X |
|---|---|---|---|
| 3,897,277 | 7/1975 | Blumenfeld | 148/171 X |
| 3,975,213 | 8/1976 | Anthony et al. | 148/1.5 |
| 3,988,764 | 10/1976 | Cline et al. | 357/60 |
| 4,006,040 | 2/1977 | Cline et al. | 148/1.5 |
| 4,017,884 | 4/1977 | Eisele et al. | 357/27 |
| 4,082,572 | 4/1978 | Anthony et al. | 29/610 X |

Primary Examiner—C. L. Albritton
Attorney, Agent, or Firm—Donald M. Winegar; James C. Davis, Jr.; Leo I. MaLossi

[57] ABSTRACT

A semiconductor magnetoresistor device embodies a plurality of spaced highly conductive planar metallic-like electrodes formed in situ by thermal gradient zone melting to maximize the increase in the current path in a magnetic field established in the device.

15 Claims, 15 Drawing Figures

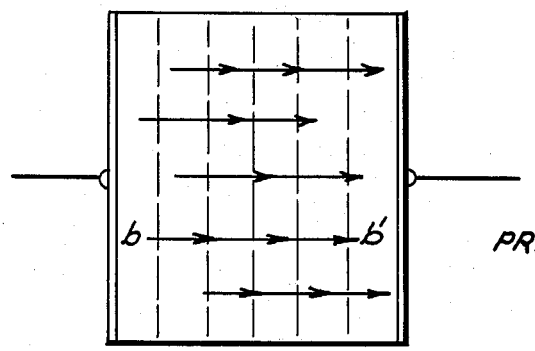
Fig. 1a.
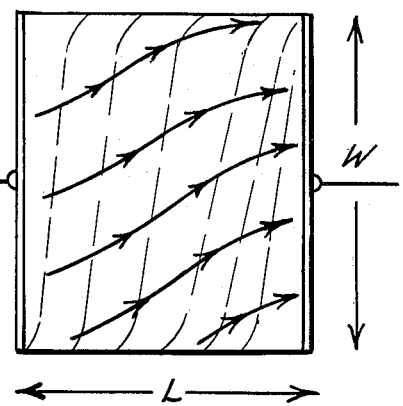
Fig. 1b.
PRIOR ART
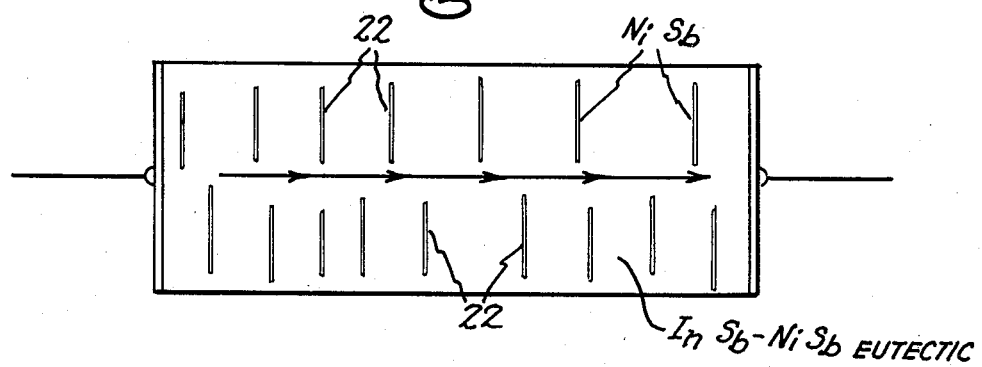
Fig. 2a.
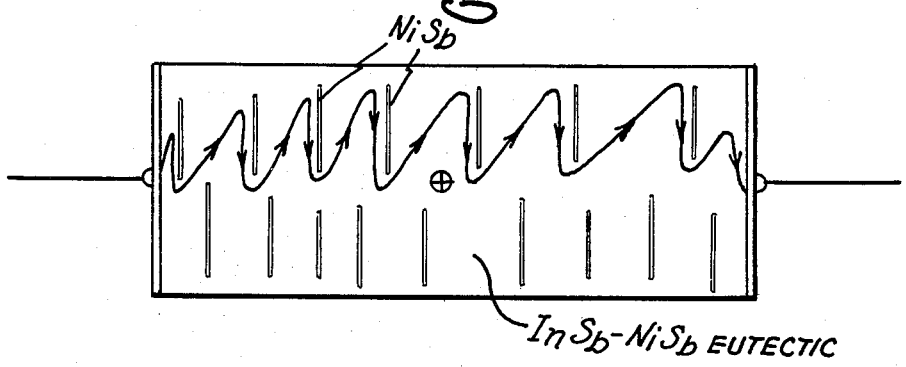
PRIOR ART Fig. 2b.

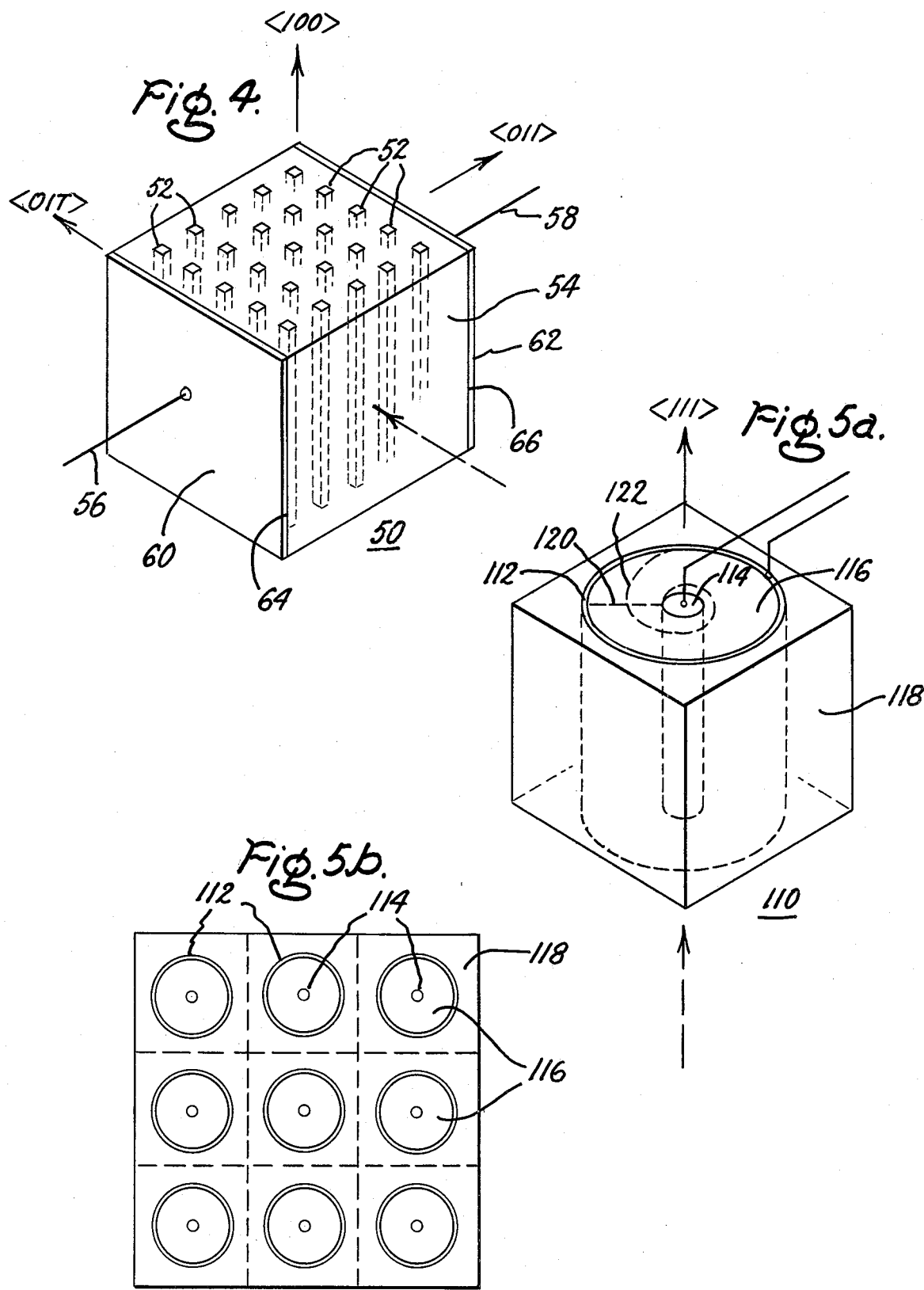

DEEP DIODE MAGNETORESISTOR

BACKGROUND OF THE INVENTION

1. Field of the Invention

This invention relates to a semiconductor magnetoresistive device whose resistance varies with a changing applied magnetic field.

2. Description of Prior Art

A semiconductive magnetoresistor is a two-pole semiconductor device which may be substituted for a conventional resistor without any circuit alteration. The ohmic resistance of a magnetoresistor increases as the square of the magnetic field for weak magnetic fields and as a linear function of the magnetic field for larger magnetic fields. The resistance change is maximized in semiconductor materials in which the carrier mobility is high. Consequently, semiconductive magnetoresistive devices are normally made from a high mobility material such as indium antimonide.

The semiconductive magnetoresistor achieves its increased resistance in a magnetic field by an increase in the electrical current path length in a conducting specimen in a magnetic field. FIG. 1a shows the carrier path and equipotential lines in a conducting semiconductive magnetoresistor with metallic contacts in the absence of a magnetic field. FIG. 1b shows the electrical current path and equipotential lines with a magnetic field perpendicular to the plane of the drawing. The curvature of the electrical current path is caused by the Lorentz force of the magnetic field on the current carriers. The increased length in the electrical current path is the cause of increased resistance of the semiconductor magnetoresistor. The equipotential lines are rotated within the semiconductor body as charge builds up on the sides 1-2 and 3-4 of the specimen from the transverse component of the electrical current and generates an electrical field across the specimen. This electrical field is the source of the well known Hall voltage. The Hall voltage generated across the specimen opposes the further transverse flow of current carriers so that the current flow away from the metallic electrodes returns to a longitudinal flow along b-b' (FIG. 1a) thereby decreasing the current path length and thus the magnetoresistance. Near the electrodes both the current paths and the equipotential lines are affected by the much smaller carrier mobility and much higher carrier density of the metal electrodes. Because of the high carrier density and decreased carrier mobility in the metal electrodes, the average velocity of the carriers moving along the imposed electric field in the metal is much smaller than the average velocity of carriers in the semiconductor body where relatively very few high-mobility carriers move at high velocities along the imposed electric field to carry the same amount of current as through the metal electrodes. Since the Lorentz force depends directly on the charged carrier velocity, it is negligible in the metal compared to the direct force of the imposed electric field. Consequently, the carriers move straight through the metal electrodes along longitudinal lines parallel to the sides 1-2 and 3-4, making the metallic electrodes equipotential lines.

In order to satisfy conditions of continuity between the metallic electrodes and the semiconductor body, both current and equipotential lines are rotated in the manner shown in FIG. 1b. This rotation increases the current path within about an electrode width in the semiconductor body and causes an increase in the resistance of the device. That portion of the semiconductor body more than about an electrode width away from the two electrodes does not increase the resistance of the device because the current path is not any longer in a magnetic field than in the absence of a magnetic field in this region, since in both cases the current is practically parallel to sides 1-2 and 3-4.

Consequently, to maximize the change in resistance of the device in a magnetic field, it is desirable to have a small spacing L between the metallic electrodes or their equivalent substitutes relative to their transverse dimensions W.

With a given size semiconductor body, this restriction suggest that a parallel series of metallic electrodes plates be placed at small interelectrode spacings in the semiconductor body in order to maximize the increase in the current path in a magnetic field.

One means of nearly achieving this arrangement in a practical magnetoresistance material such as InSb has been disclosed by Weiss [(H. Weiss & N. Wilhelm, Z. Physik 176, 399 (1963)]. Weiss fabricated an InSb-NiSb eutectic crystal by directional solidifcation in which the NiSb is present as parallel needle-like inclusions 22 of a mean length of 50μ InSb crystal. These NiSb inclusions have a conductivity $[7 \times 10^4 \, (\Omega\text{-cm}^{-1})]$ two orders of magnitude greater than intrinsic or slightly n-doped indium antimonide $[300 \, (\Omega\text{-cm})^{-1}]$.

A magnetoresistor can be made from this material by cutting out a section of the crystal and placing electrical contacts so that the parallel needle inclusions of NiSb are perpendicular to the current flow in the absence of a magnetic field. Without a magnetic field, the current flow is perpendicular to the applied voltage equipotential lines and flows straight through the specimen as shown in FIG. 2a. In a magnetic field perpendicular to the plane of the figure, the current no longer flows perpendicular to the applied voltage equipotential lines shown in FIG. 2a, but is deflected by the Lorentz force (charge X velocity X magnetic field) in direction more parallel to the needles as shown in FIG. 2b. Since the NiSb shortcircuiting needles 22 are analogous to the metal electrodes discussed above, these needles 22 remain at a equipotential with the result that current injected into one portion of a needle 22 will flow towards the other parts of a needle 22 to maintain the equipotential along the needle 22. Thus the current flow will flow in a zig-zag path as shown in FIG. 2b. Because of the elongation of the current path in a magnetic field in FIG. 2b relative to the current path without a magnetic field in FIG. 2a, the device will have a higher two-pole resistance in a magnetic field than without a magnetic field.

Although the directional solidification of the InSb-NiSb eutectic produces a usable commercial magnetoresistor, factors associated with the use of this process limit the performance of the resulting magnetoresistor. These limitations are as follows:

(a) instead of the desired highly conducting planar morphology, the eutectic process produces the less desirable needle-like morphology for the highly conducting phase.

(b) the average needle length is only 50μ and thus does not extend across the whole width of the magnetoresistor, thereby reducing the performance of the magnetoresistor.

(c) the conductivity of the needle-like phase is the inherent conductivity of the nickel antimonide compound and cannot be increased to enhance the magnetoresistance effect.

(d) the carrier mobility in the resistor varies from values readily obtainable in bulk indium antimonide, thereby reducing the magnitude of the resistance change. This reduction in carrier mobility in the eutectic indium antimonide results from: (1) the stress and strains produced by the differential thermal contraction of the InSb and NiSb phases on cooling from the eutectic point, and (2) the inadvertent incorporation of trace impurities in the eutectic melt during the high-temperature solidification processing as well as the unavoidable incorporation of the solubility limit of nickel in the indium antimonide eutectic phase.

(e) the volume fraction of both semiconductor and conductor are fixed and predetermined when an eutectic is used so that this feature of an eutectic magnetoresistor cannot be optimized to give the desired ideal mixture of phases.

Therefore, it is an object of this invention to provide a new and improved semiconductor magnetoresistor which overcomes the limitations of the prior art devices.

Another object of this invention is to provide a new and improved semiconductor magnetoresistor with highly conducting planar regions in place of the current highly-conducting needle-like regions.

Another object of this invention is to produce a semiconductive magnetoresistor in which the dimensions of the highly conducting region are not limited and are such that the conducting region can extend across the entire specimen width.

Another object of this invention is to produce a semiconductive magnetoresistor in which the conductivity of the highly conducting phase can be varied to optimize device performance.

Another object of this invention is to produce a semiconductive magnetoresistor in which the carrier mobility in the semiconductive phase is as high as that available in large bulk crystals of the pure semiconductive phase.

Another object of this invention is to produce a semiconductive magnetoresistor in which the volume fraction of the conducting phase can be varied to optimize device performance.

Other objects of this invention will, in part, be obvious and will, in part, appear hereinafter.

BRIEF DESCRIPTION OF THE INVENTION

In accordance with the teachings of this invention, there is provided a semiconductor magnetoresistor comprising a body of single crystal semiconductor material having first and second major opposed surfaces, a selected first level of resistivity and a first type conductivity. A plurality of regions of a selected second level of resistivity and first type conductivity is disposed in the body. The magnitude of the selected second level of resistivity is less than the magnitude of the selected first level of resistivity. The regions of a selected second level of resistivity extend between and terminate in both the two major opposed surfaces and the two side surfaces of the semiconductor body. The material of each of the regions of selected second resistivity is recrystallized semiconductor material of the body having solid solubility of a material therein to impart the selected second level of resistivity thereto. The regions of selected second level of resistivity are made by the thermal migration of metal-rich alloy liquid zones utilizing the temperature gradient zone melting process. Means are provided for electrical connections on opposing end planes or surfaces of the semiconductor body so that the semiconductor body can function as a resistive element in an electrical circuit.

DESCRIPTION OF THE DRAWINGS

FIG. 1a is a schematic diagram of the current path and equipotential lines in a prior art magnetoresistor with highly conductive metal end zones when operable;

FIG. 1b is a schematic diagram of the magnetoresistor of FIG. 1a when functioning in magnetic field impressed thereon;

FIG. 2a is a schematic diagram of a prior art intermetallic-semiconductor eutectic magnetoresistor device;

FIG. 2b is a schematic diagram of the magnetoresistor device of FIG. 2a when functioning in a magnetic field impressed thereon;

FIG. 4 is an isometric view of a magnetoresistor produced by droplet migration by TGZM along the <100> axis;

FIG. 5a is an isometric view of another embodiment of a magnetoresistor produced by droplet migration by TGZM along the <100> axis.

FIG. 5b is a top planar view of an arrangement of a plurality of magnetoresistors of FIG. 5a produced by TGZM along the <100> axis.

DESCRIPTION OF THE INVENTION

Figure 3A:
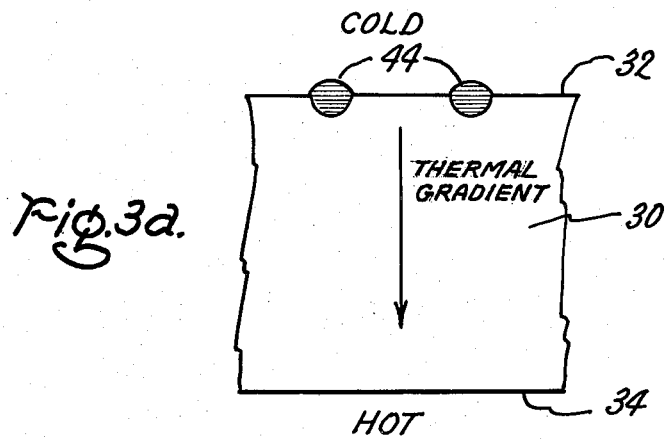
FIGS. 3a through 3d are side elevation views in cross-section of a body of semiconductor material being processed in accordance with the teachings of this invention.

With reference to FIGS. 3a-3d, there is shown a body 30 of semiconductor material having a first predetermined level of resistivity and a first type conductivity. The body 30 has major opposed surfaces 32 and 34 which are, respectively, the top and bottom surfaces thereof. The semiconductor material comprising body 30 may be silicon, germanium, silicon carbide, indium arsenide, indium antimonide, a compound of a Group II element and a Group VI element, and a compound of a Group III element and a Group V element. The semiconductor material preferably has a high carrier mobility characteristics such as that available in indium antimonide.

The body 30 is mechanically polished, chemically etched to remove any damaged surfaces, rinsed in deionized water and dried.

The preferred method of processing the semiconductor body 30 depends on the crystallographic orientation of surface 32. The thermal migration of metal wires is preferably practiced in accordance with the planar orientations, thermal migration directions, stable wire directions and stable wire sizes of the following Table:

| Wafer Plane | Migration Direction | Stable Wire Directions | Stable Wire Sizes |
|---|---|---|---|
| (100) | <100> | <011>* | <100 microns |
|  |  | <0$\bar{1}$1> | <100 microns |
| (110) | <110> | <1$\bar{1}$0>* | <150 microns |
| (111) | <111> | (a) <01$\bar{1}$> |  |
|  |  | <10$\bar{1}$> | <500 microns |
|  |  | <1$\bar{1}$0> |  |
|  |  | (b) <11$\bar{2}$>* |  |
|  |  | <$\bar{2}$11> | <500 microns |
|  |  | <1$\bar{2}$1> |  |
|  |  | (c) Any other* direction in (111) plane | <500 microns |

*The stability of the migrating wire is sensitive to the alignment of the thermal gradient with the <100>, <110> and <111> axis, respectively.
Group (a) is more stable than group (b) which is more stable than group (c).

The body 30 has a vertical axis which is aligned $\geq 0°$ to $\leq 10°$ with a first crystal axis of the material of the body. The vertical axis substantially perpendicular to the two opposed major surface 32 and 34.

It has been discovered that when the substrate or body 30 is silicon, germanium, silicon carbide, gallium arsenide semiconductor material and the like, the migrating metal droplet has a preferred shape which also gives rise to the regions being formed to have the same shape as the migrating droplet. In a crystal axis direction of <111> of thermal migration, the droplet migrates as a triangular platelet laying in a (111) plane. The platelet is bounded on its edges by (112) planes. A droplet larger than 0.10 centimeter on an edge is unstable and breaks up into several droplets during migration. A droplet smaller than 0.0175 centimeter does not migrate into the substrate 30 because of a surface barrier problem.

The ratio of the droplet migration rate over the imposed thermal gradient is a function of the temperature at which migration of the droplet is practiced. At high temperatures, of the order of from 1,000° C. to 1,400° C., the droplet migration velocity increases rapidly with increasing temperature. A velocity of 10 centimeters per day or $1.2\times10^{-4}$ centimeter per second is obtainable for aluminum droplets in silicon.

The droplet migration rate is also affected by the droplet volume. In an aluminum-silicon system, the droplet migration rate decreases by a factor of two when the droplet volume is decreased by a factor of 200.

A droplet migrates in the <100> crystal axis direction as a pyramid bounded by four forward (111) planes and a rear (100) plane. Careful control of the thermal gradient and migration rate is a necessity. Otherwise, a twisted region may result. It appears that there is a non-uniform dissolution of the four forward (111) facets in that they do not always dissolve at a uniform rate. Non-uniform dissolution of the four forward (111) facets may cause the regular pyramid shape of the droplet to become distorted into a trapezoidal shape.

The temperature gradient zone melting process and apparatus is not a part of this invention. For a more thorough understanding of the temperature gradient zone melting process employed in this invention and for a more thorough description of the apparatus employed for this process, one is directed to the following U.S. Patents entitled "Method of Making Deep Diodes," No. 3,901,736; "Deep Diode Devices and Method and Apparatus," No. 4,075,038; "High Velocity Thermomigration Method of Making Deep Diodes," No. 3,898,106; "Deep Diode Device Having Dislocation Free P-N Junctions and Method," No. 3,902,925; "The Stabilized Droplet Method of Making Deep Diodes Having Uniform Electrical Properties," No. 3,899,361; "Isolation Junctions With Semiconductor Devices," No. 3,988,763; and "Thermomigration of Metal-Rich Liquid Wires Through Semiconductor Materials," No. 3,899,362.

Figure 3B:
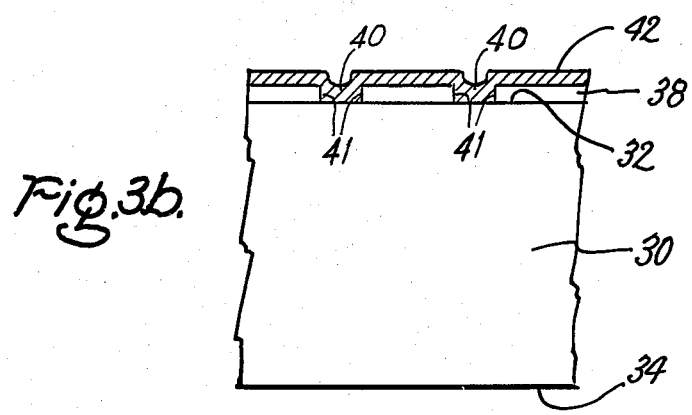

In order to more particularly describe the invention, the body 30 is said to be made of N-type indium antimonide and is selected as an example because it has a mobility of 50,000 centimeters$^2$ per second per volt. The surface 32 is parallel with or has a preferred <100> crystallographic planar orientation. A layer 38 of a photoresist material such, for example, as Kodak Metal Etch Resist, is disposed on the surface 32 of body 30 employing well-known photolithographical techniques. The photoresist layer 38 is dried by baking at a temperature of $\sim 80°$ C. A suitable mask defining one or more geometric shapes such as, for example, a parallel array of lines is placed over the layer of photoresist. With the intervening mask in place, the unmasked portion of photoresist layer is exposed to ultraviolet light. After exposure, the layer of photoresist is washed in xylene to open windows 40 defined by walls 41 in the photoresist layer 38 corresponding to the geometric pattern of the mask. The processed body 30 is disposed in a metal evaporation chamber. A metal layer 42 is deposited on the remaining portions of the layer 38 of photoresist and on surface 32 of semiconductor body 30 exposed through the window 40 in the photoresist layer 38 (FIG. 3b). The metal deposited through the windows 40 in the photoresist layer 38 becomes the metal-rich liquid zones that are to be thermally migrated through the solid semiconductor body 30. The metal layer 42 comprises a material, either substantially pure in itself or alloyed with one or more other materials to impart the second level of resistivity to the recrystallized semiconductor material of body 30 formed in situ by the migration of the metal-rich liquid zones. The thickness of layer 42 is from about 0.1 to about 30 microns with a preferred thickness of about 5 microns. When the semiconductor body 30 is N-type indium antimonide, suitable materials for the metal layer 42 include, but not by way of limitation, nickel, iron, or chromium containing greater than 0.1 atomic percent of tellerium or selenium. When the semiconductor body 30 is P-type indium antimonide, a suitable material for the metal layer 42 is indium containing at least 0.1 atomic percent zinc or cadmium. Prior to migrating the metal-rich zones through the semiconductor body 30 the excess metal contained in the metal layer 42 overlying the photoresist layer 38 is removed by stripping off the photoresist and thus the overburdening metal layer with a suitable photoresist remover such, for example, as commercially-available 5-100. The completed process body 30 is shown in FIG. 3C.

With a (100) crystallographic orientation for surface 32 of body 30, thermal migration of the metal-rich zones is practiced in the <100> direction perpendicular to the surface 32. (See the Table.) In this case, lines or line-like features, such as an orthogonal grid, in the geometric mask pattern must conform to the sizes and crystallographic directions listed in the Table to ensure stability of the migrating metal-rich liquid zones.

The vapor deposition of the layer 40 of metal should be performed at a pressure of less than $5\times10^{-5}$ Torr. When the pressure is greater than $5\times10^{-5}$ Torr, we have found that the deposited metal does not readily penetrate into the semiconductor body 30, when thermal migration is attempted. It is believed that the layer of metal becomes saturated with oxygen and other gases at pressures greater than $5 \times 10^{-5}$ Torr and that good wetting and contact between the deposited metal layer 42 and the underlying semiconductor body 30 is thus prevented. The preferred methods of depositing the metal layer 42 on preferred surfaces 32 or 34 of the semiconductor body 30 are by the electron beam method, the tungsten filament method and the like wherein high rates of metal deposit ion are achieved so as to reduce the amount of gaseous impurities entrapped in the deposited metal layer 42.

Figure 3C:
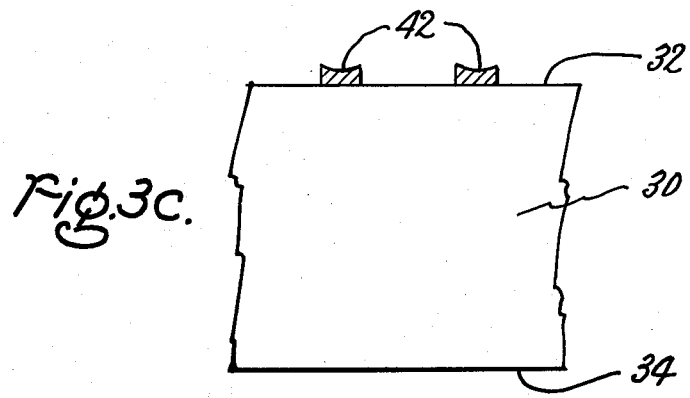
Figure 3D:
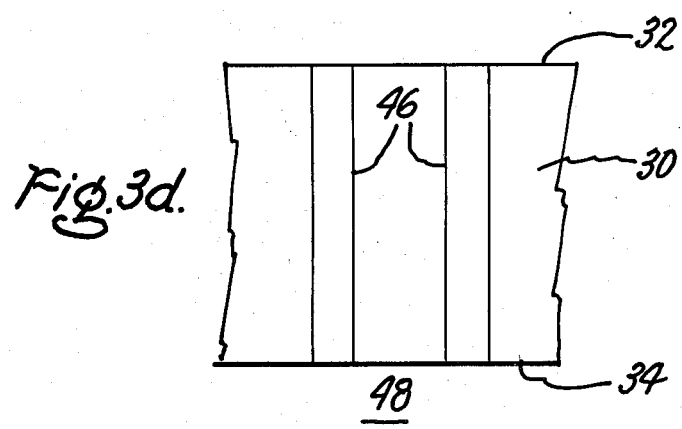

Referring now to FIG. 3C, the processed body 30 is placed in a thermal migration apparatus, not shown, and the metal 42 in the window regions 40 forms a liquid zone 44 (FIG. 3a) of metal-rich alloy comprised of the metal of layer 42 and the semiconductor material of body 30 (FIG. 3d). The liquid zones are thermally migrated through the solid semiconductor material of the body 30 by a thermal gradient zone melting process. An unidirectional thermal gradient of from 50° C. per centimeter to about 200° C. per centimeter between the bottom surface 34, which is the hot face, and the surface 32, which is the cold face, is developed in the semiconductor body 30 by the radiant energy source of suitable thermal migration apparatus.

In the case of a nickel metal layer 42 and an N-type indium antimonide semiconductor body 30, the average temperature of body 30 is between 500° C. and 525° C. In the case of an indium metal layer 42 and a P-type indium antimonide semiconductor body 30, the average temperature of body 30 is between 175° C. and 525° C. The process is practiced for a sufficient length of time to migrate the metal-rich zone 44 through the body 30. The process produces regions 46 of recrystallized semiconductor material of the body 30 in situ. The metal of the melt is present in each region 46 to the extent of the solid solubility limits of that metal in that semiconductor material. The concentration of the metal is substantially uniform throughout. For example, for indium metal of 5 microns thickness, a thermal gradient of 50° C./cm, a temperature of body 30 of 400° C., and an inert atmosphere, a furnace time of less than 10 hours is required to migrate the indium-rich liquid zone 44 through the indium antimonide body 30 of 1 centimeter thickness.

By migrating lines aligned along the $<011>$ and $<0\bar{1}1>$ stable wire directions in the $<100>$ migration direction, relatively highly conductive planar regions extending through the body 30 can be produced in $<100>$ crystallographic oriented semiconductor material. These conductive regions which can range in width from $5 \times 10^{-4}$ cm to 0.1 cm can be placed as close as $10 \times 10^{-4}$ cm apart. To obtain the highest change in resistance in a magnetic field, the ratio of the width of the specimen to the separation distance between conductive zones should be maximized.

With reference to FIG. 4 there is shown a magnetoresistor 50 which has an alternative conductive zone configuration for $<100>$ oriented semiconductor material. The configuration is an array of columnar zones or regions 52 extending entirely through a body 54 of semiconductor material in the $<100>$ migration direction. These columnar regions or zones 52 are formed by migrating appropriately doped metal-rich alloy liquid droplets through the body 54 along a thermal gradient in the $<100>$ migration axis direction. Electrical leads 56 and 58 are affixed to respective electrical contacts 60 and 62 which in turn form ohmic electrical contacts to respective end surfaces 64 and 66 of the body 54. To maximize the magnetoresistance effect, the ratio of the body width to the columnar separation should be large.

Magnetoresistors 48 can also be produced from (111) semiconductor material crystals. Again either planar 46 or colmnar zones or regions 52 are produced that extend across the width of the body 30 or 54 of semiconductor material by migrating lines or droplets in the $<111>$ migration axis direction.

The ratio of the width of the body 30 or 54 to the distance separating mutually adjacent conductive zones or regions 46 and 52 should be maximized to produce devices exhibiting the greatest magnetoresistance effect when the magnetic field is applied perpendicular to both the path of the current and the longitudinal axes of the regions 46 and 52. Zones as small as $10 \times 10^{-4}$ cm in width can be migrated in the $<111>$ direction. Zones greater than 0.1 cm in width or diameter though produced by unstable droplet or wire melt migration can produce workable magnetoresistance devices. Any stresses and strains which may be produced from the growth of recrystallized semiconductor material in these zones, by undesireable impurities will slightly degrade the magnetoresistive effect by causing a decrease in carrier mobility in the adjacent higher resistivity semiconductor zones or regions 46 or 52.

With $<111>$ semiconductor material crystals, it is possible to produce magnetoresistor devices with geometries that produce the theoretically highest resistance changes in a magnetic field. The condition for reaching this upper limit is that equipotential lines remain unchanged in orientation in a magnetic field. This situation is obtainable by making a magnetoresistor 110 (FIG. 5) containing a doubly electrically connected semiconductor domain with one highly conducting region 112 enclosing another highly conducting region 114. For $<110>$ crystals, such doubly connected domains may be produced in two ways. First, liquid alloy circles around a liquid alloy droplet can be migrated individually or simultaneously by thermal gradient zone melting processing along the $<111>$ migration crystal axis direction to produce the outer tubular highly conductive columnar region 112 encircling the inner highly conductive region 114 which a doubly electrically connected semiconductive region 116 of material of the body 118 lying inbetween. The resulting structure is like a coaxial cable. In the absence of a magnetic field, the current path is a simple straight radial line 120 from the central inner columnar region 114 to the outer cylindrical highly conducting region 112. When a magnetic field is applied perpendicular to the impressed current flow and parallel with the longitudinal axis of end region 112 and 114 which is parallel to the vertical axis of the body 118, the current proceeds along a considerably lengthened logarithmic spiral path 122 in region 116 between the inner and outer highly conductive regions 114 and 112, respectively. A plurality of devices 110 can be produced by migrating stable wires which after thermal migration produce planar regions 124 for dicing into individual devices for the electrical isolation shown in FIG. 5b.

Figure 6A:
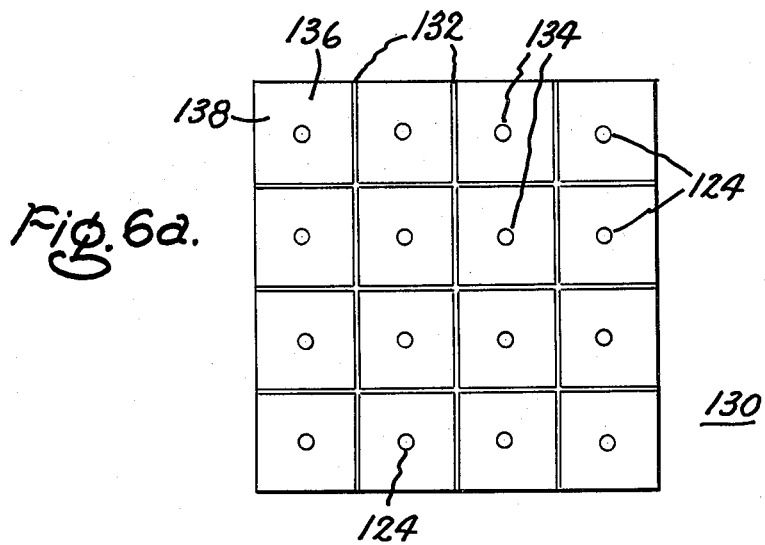
FIGS. 6a, 6b and 6c are top planar view of various arrangements of making a plurality of magnetic resistor with the desirable doubly-connected semiconductor domain produced by migrating liquid alloy grids of various geometries and liquid alloy droplets.
Figure 6B:
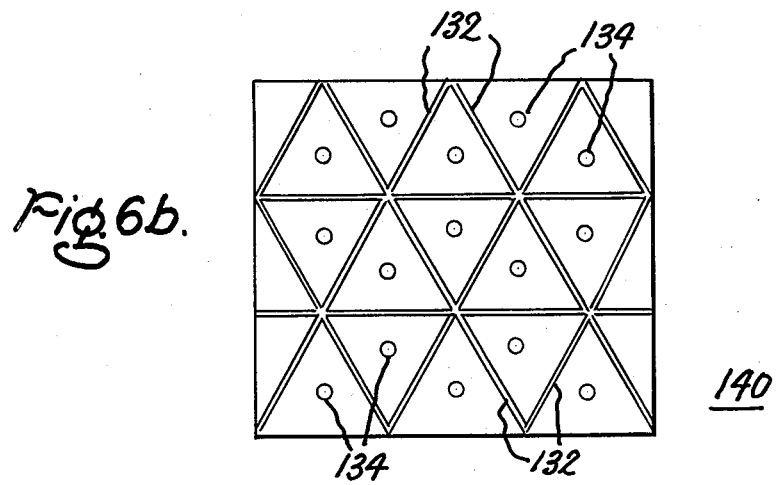
Figure 6C:
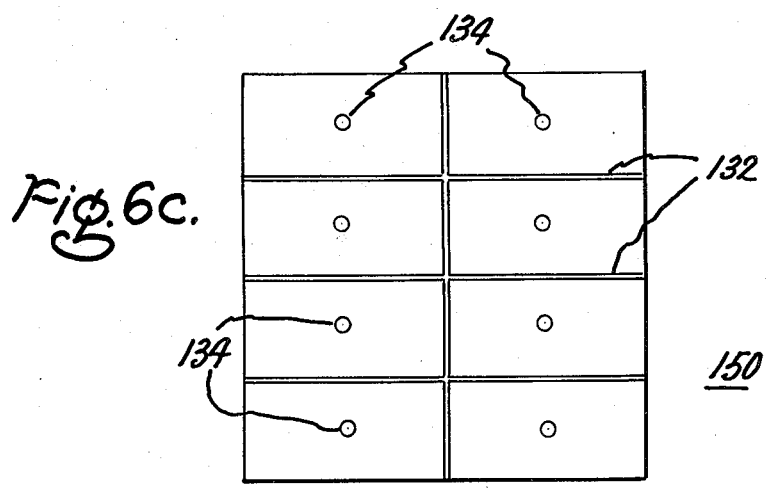

Referring now to FIG. 6a, 6b and 6c, a second means of producing respective doubly connected semiconductor magnetoresistors 130, 140, and 150 is by the thermal migration of an array of metal wire and an array of droplets. The geometry of the metal wires is such as to form a grid of a preferred geometrical configuration such as a hexagon, a square as shown in FIG. 6I, a triangle as shown in FIG. 6b and a rectangle as shown in FIG. 6c. Each metal wire of the array is aligned substantially parallel with a second crystal axis of the material comprising the body 131. After TGZM migration, a group of intersecting planar regions 132 are formed in, and divide the body 131 into a plurality of individual cells 136 of domains or regions 138 of semiconductor material of the body 131 in which a region 134 has also been formed by the TGZM migration. An ohmic electrical contact 142 is affixed to each region 134. An ohmic electrical contact 144 may be affixed to one or more of the planar regions 132. Each of the regions 132, 134 and 138 have a longitudinal axis parallel to the vertical axis of the body 131 and the same type conductivity. The recrystallized material of the regions 132 and 134 have a level of resistivity which is less in magnitude than the level of resistivity of the material of the regions 138.

Each of the magnetoresistors 130, 140 and 150 achieves the greatest magnetoresistive effect when an electrical current is impressed between the ohmic contacts 142 and 144 and the magnetic force field is applied parallel to the longitudinal axes of the regions 132 and 134 and the vertical axis of the body 131.

The following example is illustrative of the teachings of this invention.

EXAMPLE

Figure 7:
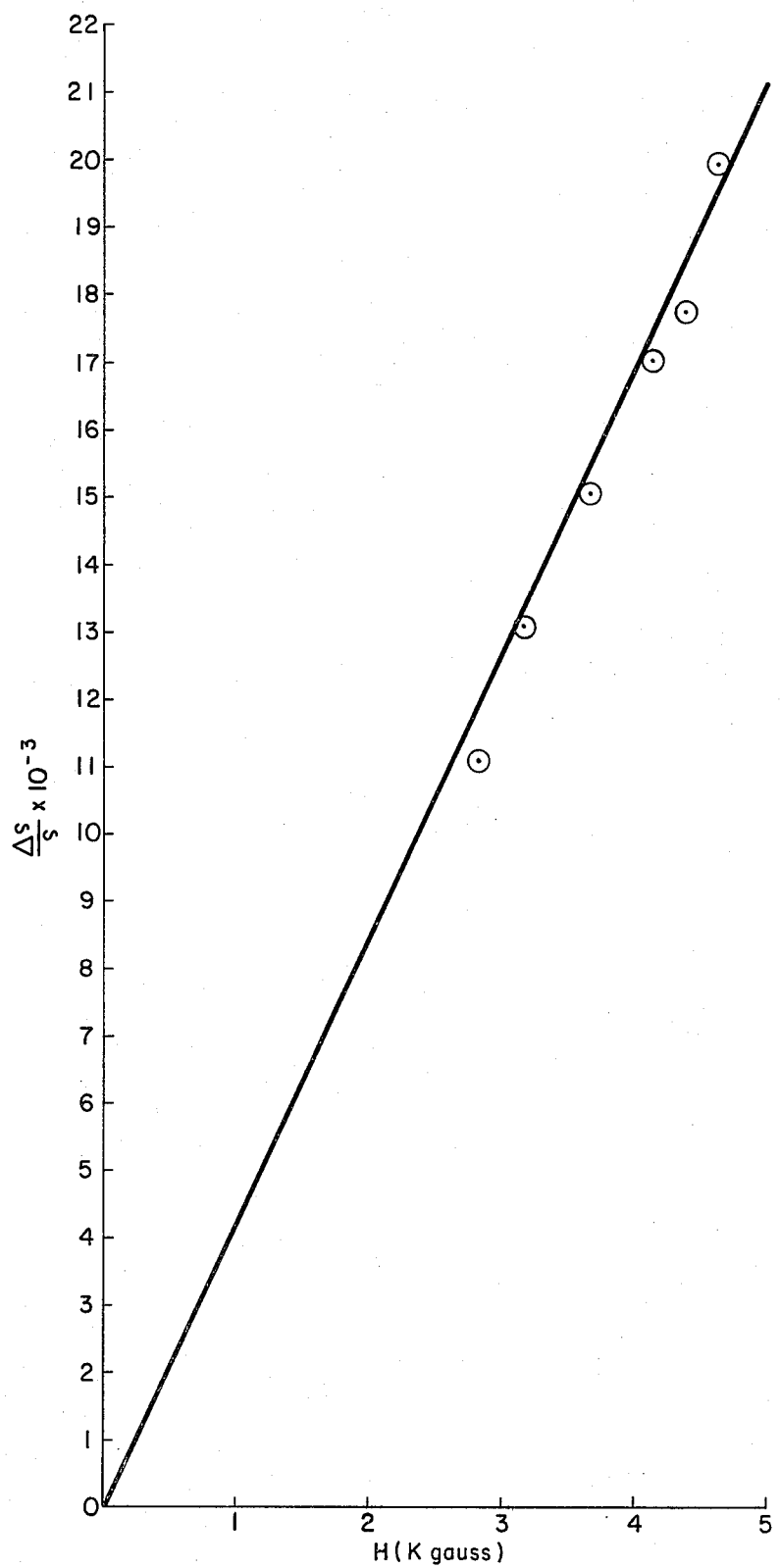
FIG. 7 is the change in resistance $\Delta \rho / \rho$ of a magnetoresistor, produced by thermal migration in silicon, in a magnetic field.

A 20 mil square array of highly-conductive P-type columns 5 mils in diameter was produced in a 1 cm thick P-type wafer of 10 ohm-cm silicon by migrating aluminum-rich liquid droplets through the silicon at a temperature of 1250° C. in 6 hours. A 3 mm slice was cut parallel to the highly conductive columns and metallic contacts were put on the end of the specimen. The sample was placed in a magnetic field which was transverse to the highly conductive columns. The resistivity increased with increasing magnetic field and produced a resistance change of 2.1% at a field of 5 Kgauss. (As shown in FIG. 7).

This change in resistance illustrates the change of resistance which can also be caused to occur in a device embodying indium antimonide semiconductor material.

We claim as our invention:

1. A magnetoresistor comprising:
a body of high carrier mobility semiconductor material having two opposed major surfaces forming respectively the top and bottom surfaces of the body, two opposed end surfaces, a first predetermined level of resistivity, a predetermined first type conductivity, a preferred crystal structure and a vertical axis substantially perpendicular to the major opposed surfaces aligned $\geq 0°$ to $\leq 10°$ with a first crystal axis of the semiconductor material of the body;
at least one of the opposed major surfaces having a predetermined crystal planar orientation which is one selected from the group consisting of (100), (110), and (111);
a plurality of spaced, substantially parallel regions formed in the body, each spaced region extending between, and terminating in, the opposed major surfaces of the body and oriented substantially perpendicular thereto and having a longitudinal axis and a vertical axis aligned parallel with the vertical axis of the body and from $\leq 0°$ to $\geq 10°$ with the first crystal axis of the body, a first type conductivity and a second predetermined level of resistivity, which is lower in magnitude than that of the first predetermined level of resistivity;
each spaced region consisting of recrystallized semiconductor material of the body formed in situ by the migration of a melt of a metal-rich semiconductor material of the body through the material of the body by thermal gradient zone melting at a predetermined elevated temperature along a thermal gradient aligned substantially parallel with the vertical axis of the body and having a predetermined level of concentration of the metal of the melt therein as determined by the solid solubility limit of that metal in that semiconductor material at that predetermined elevated temperature of migration;
the metal is distributed substantially uniformly throughout the recrystallized material of each spaced region and the metal includes at least one dopant impurity material to impart the first predetermined type conductivity and the second predetermined level of resistivity to the recrystallized semiconductor material;
an ohmic electrical contact affixed to each of the two end surfaces of the body;
whereby when the body is placed in a magnetic field and an electrical current is impressed through the body between the two ohmic electrical contacts, the magnetoresistor functions as a variable electrical resistor, the magnitude of which is dependent upon the magnitude of the magnetic field acting on the body perpendicular to both the path of the electrical current and the longitudinal axis of each region.

2. The magnetoresistor of claim 1 wherein the semiconductor material is indium antimonide.

3. The magnetoresistor of claim 2 wherein the first type conductivity is N-type, and the dopant impurity material is nickel.

4. The magnetoresistor of either claim 1, 2 or 3 wherein the plurality of regions is an array of columnar regions.

5. The magnetoresistor of either claim 1, 2, or 3 wherein the regions are spaced planar regions extending the full width of the body parallel to the two opposed end surfaces and so oriented as to be aligned with a second crystal axis of the material of the body.

6. The magnetoresistor of claim 5 wherein the preferred planar crystal orientation is (100), the first crystal axis is $<100>$, and the second crystal axis is one selected from the group consisting of $<01\bar{1}>$ and $<0\bar{1}1>$.

7. The magnetoresistor of claim 5 wherein preferred planar crystal orientation is (110), the first crystal axis is $<110>$, and the second crystal axis is $<1\bar{1}0>$.

8. The magnetoresistor of claim 5 wherein the preferred planar crystal orientation is (111), the first crystal axis is $<111>$, and the second crystal axis is one selected from the group consisting of $<01\bar{1}>$, $<10\bar{1}>$, $<1\bar{1}0>$, $<11\bar{2}>$, $<\bar{2}11>$ and $<1\bar{2}1>$.

9. A magnetoresistor comprising:
a body of high carrier mobility semiconductor material having two opposed major surfaces forming respectively the top and bottom surfaces of the body, a first predetermined level of resistivity, a predetermined first type conductivity, a preferred crystal structure and a vertical axis substantially perpendicular to the major opposed surfaces aligned from $\geq 0°$ to $\leq 10°$ with a first crystal axis of the semiconductor material of the body;

at least one of the opposed major surfaces having a predetermined crystal planar orientation which is one selected from the group consisting of (100), (110), and (111);

a plurality of spaced, substantially parallel regions formed in the body, each spaced region extending between, and terminating in, the opposed major surfaces of the body and oriented substantially perpendicular thereto, and having a longitudinal axis aligned parallel with the vertical axis of the body and from $\geq 0°$ to $\leq 10°$ with the first crystal axis of the body a longitudinal axis, a first type conductivity and a second predetermined level of resistivity which is lower in magnitude than that of the first predetermined level of resistivity;

each spaced region consisting of recrystallized semiconductor material of the body formed in situ by the migration of a melt of metal-rich semiconductor material of the body through the material of the body by thermal gradient zone melting at a predetermined elevated temperature along a thermal gradient aligned substantially parallel with the vertical axis of the body and having a predetermined level of concentration of the metal of the melt therein as determined by the solid solubility limit of that metal in that semiconductor material at that predetermined elevated temperature of migration;

the metal is distributed substantially uniformly throughout the material of the region, and the metal includes at least one dopant impurity material to impart the first predetermined type conductivity and second predetermined level of resistivity to the recrystallized semiconductor material, and individual ohmic electrical contacts affixed to each spaced region;

whereby when the body is placed in a magnetic field and an electrical current is impressed through the body between the two ohmic electrical contacts, the magnetoresistor functions as a variable electrical resistor depending upon the magnitude of magnetic field acting on the body perpendicular to the path of the electrical current and parallel with the longitudinal axis of each region.

10. The magnetoresistor of claim 9 wherein the semiconductor material is indium antimonide.

11. The magnetoresistor of claim 10 wherein the first type conductivity is N-type, and the dopant impurity material is nickel.

12. The magnetoresistor of either claim 9, 10, or 11 wherein
the plurality of regions are two spaced coaxially aligned cylindrical regions, and
the electrical current is caused to flow in a lengthened logarithmic spiral path when functioning in the applied magnetic field thereby increasing the electrical resistance of the magnetoresistor.

13. The magnetoresistor of either claim 9, 10, or 11 wherein
the plurality of regions consists of two groups of regions,
a first group of regions being spaced columnar regions,
a second group of regions being a plurality of spaced planar regions aligned substantially parallel with a particular crystal axis of the material of the body and intersecting one or more other planar regions so as to form individual cells of semiconductor material of the body having one region of the first group disposed therein, each individual cell has a geometrical configuration which is one selected from the group consisting of a square, a rectangle, a triangle and a hexagon,
an ohmic electrical contact affixed to the region of the first group in the cell,
an ohmic electrical contact affixed to at least one of the abutting planar regions of the second group dividing the body into the unit cells, and
the electrical current is caused to flow in a lengthened spiral path when functioning in the applied magnetic field thereby increasing the electrical resistance of the magneto-resistor.

14. The magnetoresistor of claim 13 wherein
the preferred planar crystal orientation is (100), the first crystal axis is $<100>$, and the second crystal axis is at least one selected from the group consisting of $<01\bar{1}>$ and $<011>$.

15. The magnetoresistor of claim 13 wherein
the preferred planar crystal orientation is (111),
the first crystal axis is $<111>$, and
the second crystal axis is one selected from the group consisting of $<01\bar{1}>$, $<10\bar{1}>$, $<1\bar{1}0>$, $<11\bar{2}>$, $<\bar{2}11>$ and $<1\bar{2}1>$.

* * * * *